United States Patent [19]
Kester

[11] Patent Number: 5,323,898
[45] Date of Patent: Jun. 28, 1994

[54] DUAL HINGED LID PACKAGE

[75] Inventor: Brian W. Kester, Rockford, Ill.

[73] Assignee: Alloyd Co., Inc., Dekalb, Ill.

[21] Appl. No.: 944,456

[22] Filed: Sep. 14, 1992

[51] Int. Cl.5 .................... B65D 85/30; B65D 43/16
[52] U.S. Cl. ................................. 206/332; 206/328;
206/334; 220/339; 220/522; 229/2.5 R
[58] Field of Search .................. 206/328, 334, 332;
220/339, 334, 522, 345; 229/2.5 R

[56] References Cited

U.S. PATENT DOCUMENTS

| | | | |
|---|---|---|---|
| 3,256,975 | 6/1966 | Puente . | |
| 3,317,097 | 5/1967 | Giordano | 220/522 X |
| 3,405,836 | 10/1968 | Regis, Jr. . | |
| 3,552,595 | 1/1971 | Gerner . | |
| 3,567,013 | 3/1971 | Tannenbaum . | |
| 3,580,650 | 5/1971 | Morris | 229/2.5 X |
| 3,651,983 | 3/1972 | Haugen | 220/339 X |
| 3,707,227 | 12/1972 | Britt . | |
| 3,926,308 | 12/1975 | Sullivan . | |
| 3,933,296 | 1/1976 | Ruskin et al. | 229/2.5 |
| 3,961,708 | 6/1976 | Von Dohlen et al. . | |
| 3,964,808 | 6/1976 | Suzuki . | |
| 3,999,661 | 12/1976 | Jones . | |
| 4,091,953 | 5/1978 | Daenen . | |
| 4,160,503 | 7/1979 | Ohlbach . | |
| 4,241,829 | 12/1980 | Hardy | 206/328 |
| 4,557,379 | 12/1985 | Lane et al. | 206/328 |
| 4,681,223 | 7/1987 | Roberts | 220/339 X |
| 4,884,718 | 12/1989 | Leahy | 220/339 |
| 5,009,311 | 4/1991 | Schenk | 206/332 |

FOREIGN PATENT DOCUMENTS 2123469 11/1972 Fed. Rep. of Germany ...... 220/339

OTHER PUBLICATIONS

Western Electric Technical Digest, No. 15, Jul. 1969.
Western Electric Technical Digest, No. 64, Oct. 1981.
Article titled "Redesigned Package Saves Time and Money", EOS/ESD Technology, Dec.-Jan. 1990-1991, Miller Freeman Publishing.

Primary Examiner—Bryon P. Gehman
Attorney, Agent, or Firm—Marshall, O'Toole, Gerstein, Murray & Borun

[57] ABSTRACT

This disclosure relates to a package forming first and second enclosures for first and second articles. The package comprises a box having a bottom and at least first and second side walls forming the first enclosure, a first lid hingedly connected to the first side wall and foldable to a closed position to cover said first enclosure, the first lid and the side walls including supports for engaging and holding the first article in place in the first enclosure. A second lid is hingedly connected to the second side wall and is foldable over the first lid to a closed position, the first lid and the second lid forming the second enclosure therebetween for the second article. Engaging surfaces on the box and on the lids hold the lids in the closed positions. The package is especially useful for holding a printed circuit board and documents relating thereto, and is made of a clear plastic having static dissipative properties.

13 Claims, 4 Drawing Sheets

DUAL HINGED LID PACKAGE

FIELD AND BACKGROUND OF THE INVENTION

This invention relates to a container or package, and more particularly to a package for a fragile article such as a printed circuit board.

Packaging a fragile and expensive article such as an electronic printed circuit board (PCB) has posed special problems. Such a container should, of course, be sufficiently sturdy to protect the article and, in the instance of a PCB, to prevent damage to the electronic components due to static electricity.

Regarding the prior art, a container for a PCB or glass plates is described in the J. R. Puente U.S. Pat. No. 3,256,975. The container includes a box and a removable lid made of a plastic material such as polyethylene, the edges of the article being clamped between the box and the lid. This container, however, does not provide for the storage in the container of documents that normally accompany articles of this nature.

According to an article that appeared in the December-January 1990-1991 issue of EOS/ESD Technology, a company in Irvine, California named Western Digital Corp. has designed a package for a PCB. The package is of the clamshell type and is made of a clear molded plastic. Apparently a PCB is placed in one-half of the package and the other half is folded over the PCB. It appears from the article that, for shipping, a separate box is required, and the package plus documents are placed in the box.

Further, U.S. Pat. No. 3,405,836 to L. S. Regis describes a mailing package for spectacles, including a box, an interior flap and an outer cover. The spectacles are loosely placed in the box and a mailing card is placed between the flap and the cover, the cover having an opening so that the mailing card may be read.

While the foregoing containers appear to work satisfactorily for their intended purposes, there remains a need for an improved package for a fragile article such as a printed circuit board and documents relating to the board.

SUMMARY OF THE INVENTION

A package constructed in accordance with the present invention is for an article and documents relating to the article, and comprises a box, a first lid and a second lid. The box includes a bottom and side walls connected to form a first enclosure, the first enclosure being shaped to receive the article. First and second of the side walls have upper edges, the upper edge of the first side wall being hinged to the first lid, and the upper edge of the second side wall being hinged to the second lid. The side walls and the first lid include means for clamping the article between them when the first lid is folded over the article. The second lid is foldable over the first lid, a second enclosure for the documents being formed between the first and second lids. The first and second lids and the side walls further include attachment means for holding said lids connected with the side walls.

BRIEF DESCRIPTION OF THE DRAWINGS

The invention will be better understood from the following detailed description taken in conjunction with the accompanying figures of the drawings, wherein.

DETAILED DESCRIPTION OF THE INVENTION

The following detailed description relates to a specific embodiment of the invention wherein the package is designed to store a printed circuit board having electrical components thereon. It should be understood, however, that a package in accordance with the invention may also be useful for storing other types of fragile articles.

The package comprises a box 11, an inner lid 12 and an outer lid 13, these three parts 11, 12 and 13 being formed integrally and hinged together as will be discussed in more detail hereinafter.

Figure 3:
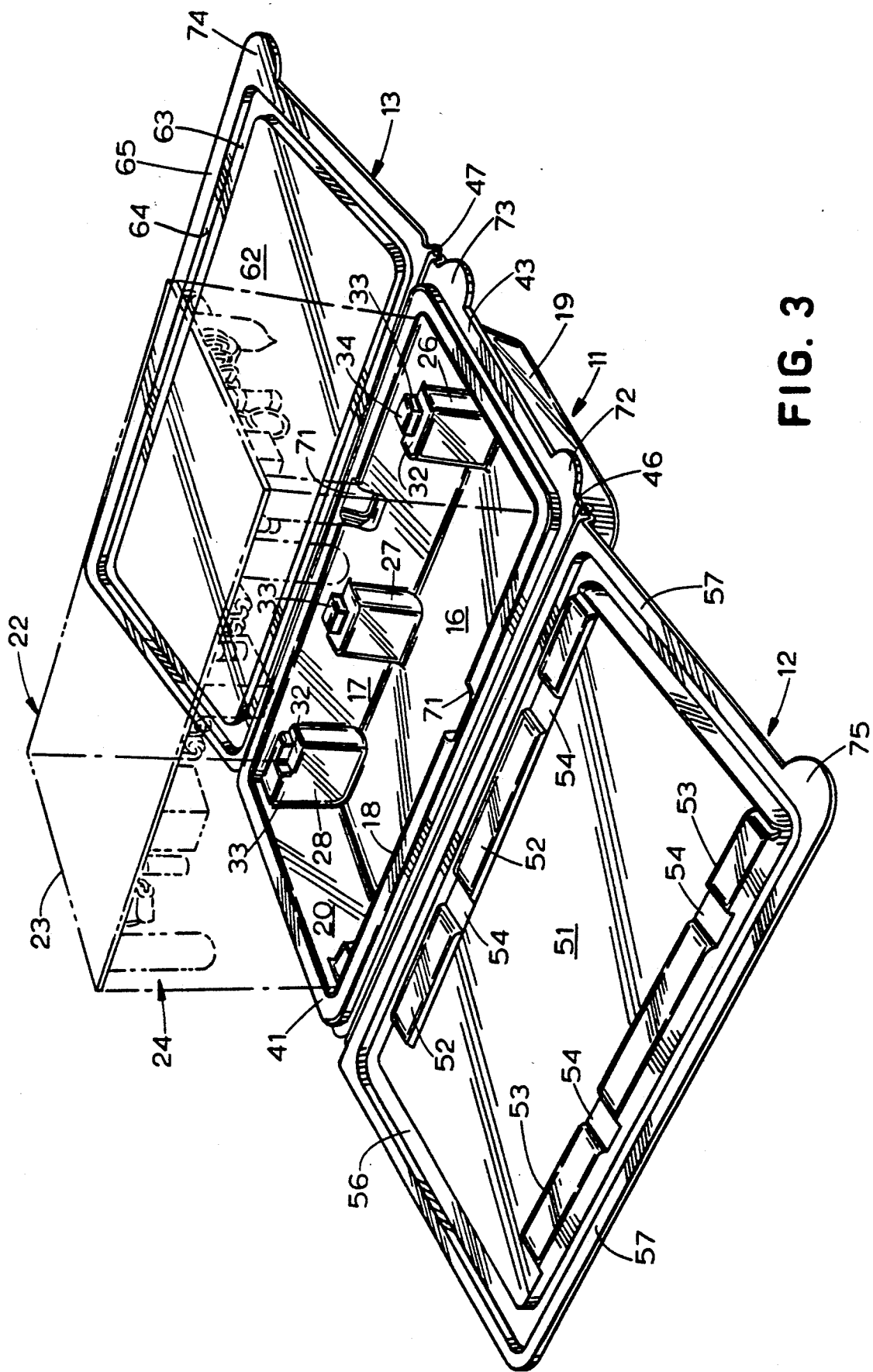
FIG. 3 is another perspective view showing the package with two lids in open positions.
Figure 4:
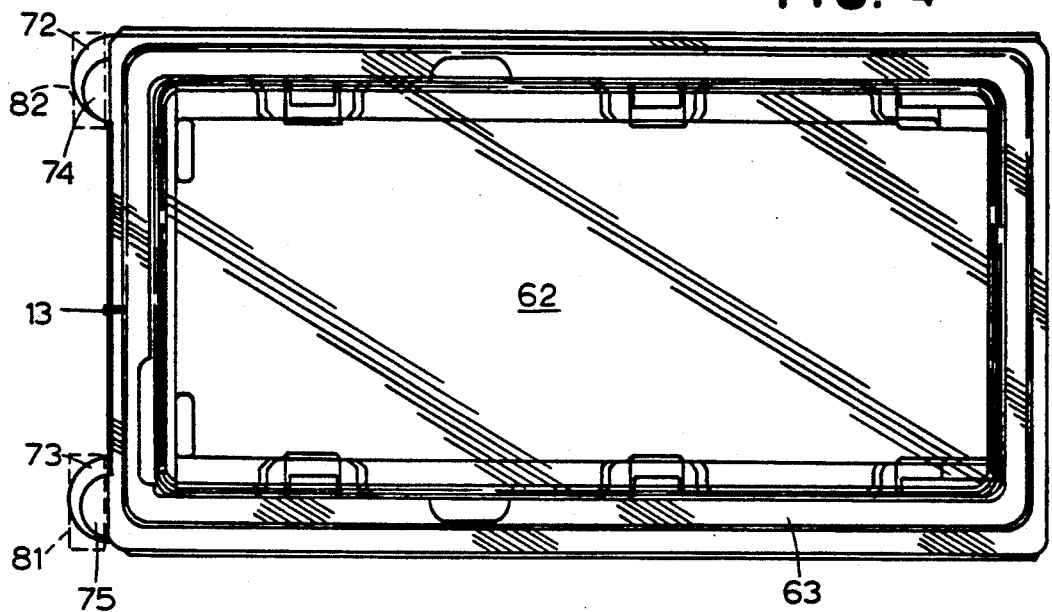
FIG. 4 is a plan view of the package.
Figure 5:
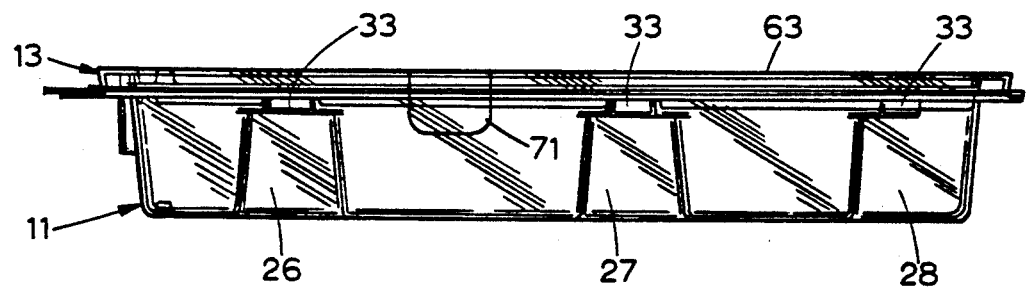
FIG. 5 is a side view of the package.
Figure 7:
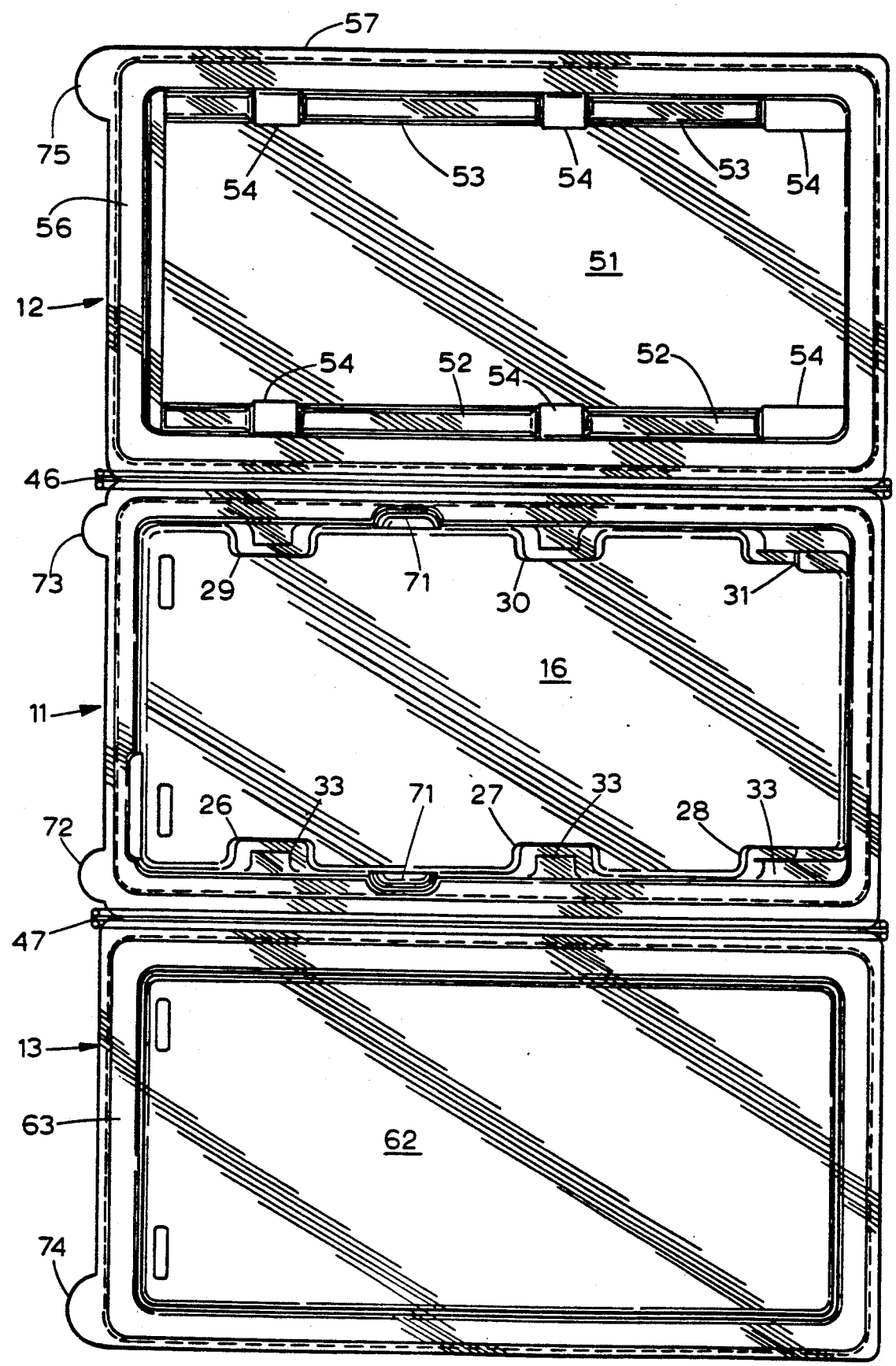
FIG. 7 is a plan view of the package showing the two lids in the open positions.

The box 11 includes a bottom wall 16, two long side walls 17 and 18, and two short side walls 19 and 20, the four walls 17 through 20 being connected to the bottom wall 16 to form a rectangular box-like configuration. The topside of the box is open when the two lids 12 and 13 are folded to their open positions as shown in FIGS. 3 and 7, and the box forming a first enclosure for the article to be packaged. The specific dimensions of the bottom and side walls, of course, depend on the size and configuration of the article to be placed therein. In the present example, the article is indicated by the reference numeral 22 and comprises a printed circuit board 23 having a plurality of electrical components 24 mounted on it. The specific configuration of the printed circuit board and the electrical components does not form part of the present invention.

Figure 6:
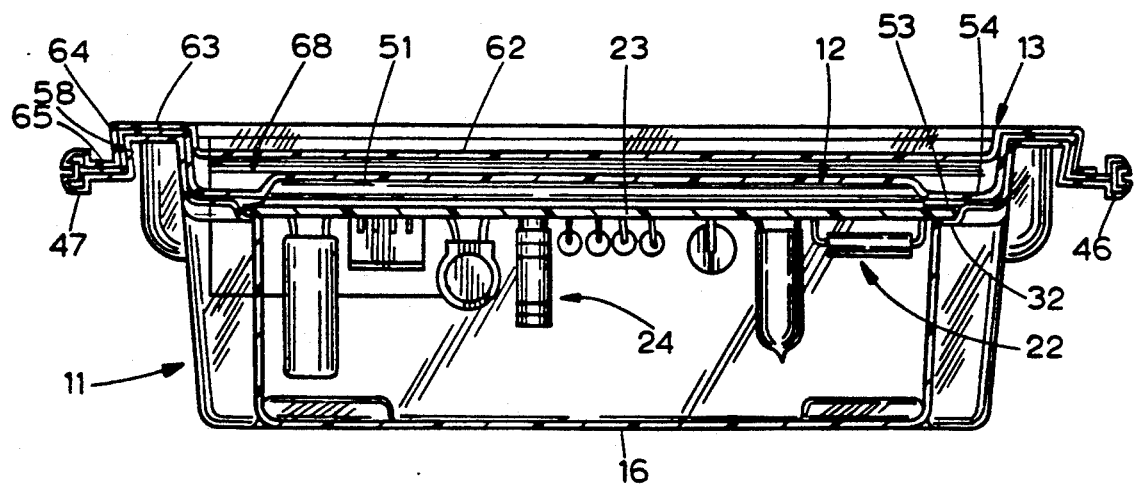
FIG. 6 is a sectional view through the package and showing an article stored in the package.

With reference to FIGS. 3 and 7, three support posts 26, 27, and 28 are formed on the side wall 17 and three support posts 29, 30, and 31 are formed on the opposite side wall 18. Each support post 26 through 31 extends upwardly from the bottom wall 16 to a location about three-fourths of the distance upwardly along the sides of the side walls 17 and 18, and the upper surfaces of the posts form support ledges 32. As shown in FIG. 6, the edge portions of the rectangular printed circuit board 24 rest on top of the ledges 32. Extending upwardly from each of the ledges 32 is a head 33 having an upper support surface 34, which supports the outer periphery of the inner lid 12 as will be described. The edges of the board 24 also engage and the board is centered by the heads 33.

The upper edges of the four side walls 17, 18, 19 and 20 extend horizontally outwardly (parallel with the bottom wall 16) and form a horizontal flange 41 around the upper periphery of the four walls. The outer edge of the flange 41 turns downwardly and forms a slanted part 42, and the lower edge of the slanted part 42 extends horizontally outwardly and forms a horizontal lip 43 which also extends around the periphery of the box.

The inner and outer lids 12 and 13 are hingedly connected to two of the four side walls 17 to 20, and in the present example, the two lids are hinged to the two long side walls 17 and 18. As shown in FIGS. 3 and 6, the outer edges of the lips 43 of the walls 27 and 18 are connected by corrugated or convoluted hinges 46 and 47 which enable the two lids 12 and 13 to be folded, relative to the box 11, between open positions shown in FIGS. 3 and 7 and closed positions illustrated in FIGS. 1 and 4–6.

The inner lid 12 includes a central generally flat interior portion 51 (see FIGS. 3 and 6) which extends over the top of the center area of the printed circuit board 22. The side of the inner lid 12 which is adjacent the hinge 46 includes offset portions 52 which, when the inner lid is folded to the closed position (FIG. 6), rest on top of the outer peripheral portions of the board 22. Similarly, on the side of lid 12 opposite from the three offset portions 52 are three additional offset portions 53 which, when the lid 12 is folded over the box 11 also engage the board. Thus the offset portions 52 and 53 are spaced slightly above the support ledges 32 and the edge portions of the printed circuit board 22 are between them. Recesses 54 are formed between the offset portions 52 and 53 and the recesses 54 receive and rest on the support surfaces 34 of the heads 33, as shown in FIG. 6.

Around the periphery of the center part 51 is a rectangular recess 56 which, when the inner lid 12 is closed on the box 11, receives the rectangular flange 41 that extends around the box 11. A rectangular horizontally extending lip 57 extends around the recess 56. As shown in FIG. 6, there is a relatively tight snap fit connection between the rectangular flange 41 of the box and the walls forming the recess 46. As best shown in FIG. 6, inwardly slanted engaging surfaces 58 form a snap-lock connection that secures or holds the inner lid in the closed position.

The outer lid 13 is shaped generally similar to the inner lid 12 and has a snap-lock connection or fit with the top of the inner lid 12. As previously mentioned, the outer lid 13 is connected to the upper edge of the other long side wall 17 by the hinge connection 47 which is constructed similarly to the hinge connection 46 of the inner lid 12. The outer lid 13 has substantially the same outer peripheral dimensions as the inner lid 12, and the lid 13 includes a relatively flat central portion 62. The portion 62 (see FIG. 6) is sized to extend over the top of the central portion 51 of the inner lid 12. The central portion 62 is bounded by a raised flange 63, a downwardly extending slanted portion 64 and an outwardly extending lip 65 which are sized to be slightly larger than the corresponding surfaces of the inner lid 12 so that the outer lid portions 63, 64 and 65 are able to extend over and snap onto the outer surfaces of the inner lid 12.

Figure 2:
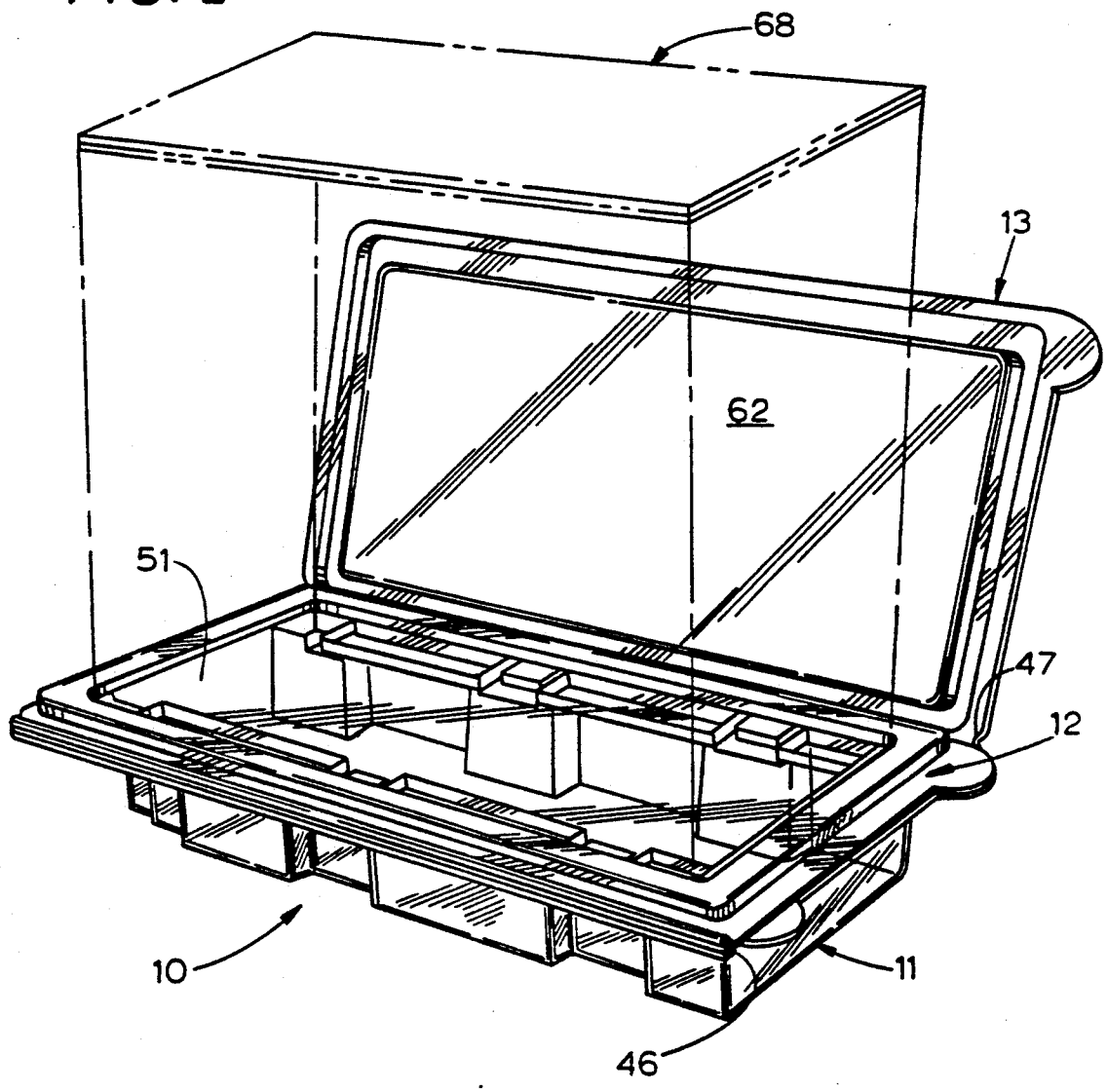
FIG. 2 is a perspective view showing the package with one lid in an open position.

While the central portion 62 of the outer lid 13 extends downwardly toward the central portion 51 of the inner lid, as illustrated in FIG. 6, a space 67 is provided between the portions 51 and 62 which is sized to receive documents relating to the printed circuit board 22, the documents being indicated by the reference numeral 68 (see FIGS. 2 and 6).

As best illustrated in FIG. 6, it is preferred that the dimensions of the bottom wall 16 of the box part 11 be slightly smaller than the outer peripheral dimensions of the depressed portion 62 of the outer lid 13. This arrangement provides a stacking capability for the boxes whereby the lower ends of the box portion 11 may be received or nested in the depressed portion. 62 of a lower box in a stack of boxes.

To facilitate the removal of a printed circuit board 23 from the enclosure formed by the box 11 and the inner lid 12, finger holes or recesses 71 (see FIGS. 3 and 7) are preferably provided in one or more of the side walls of the box 11. In the present instance, two finger holes or recesses 71 are provided near the upper edges of the two long walls 17 and 18, whereby a person may insert fingers into the recesses 71 and engage the side edges of the printed circuit board 22 to remove or insert a board without touching the electrical components.

Figure 1:
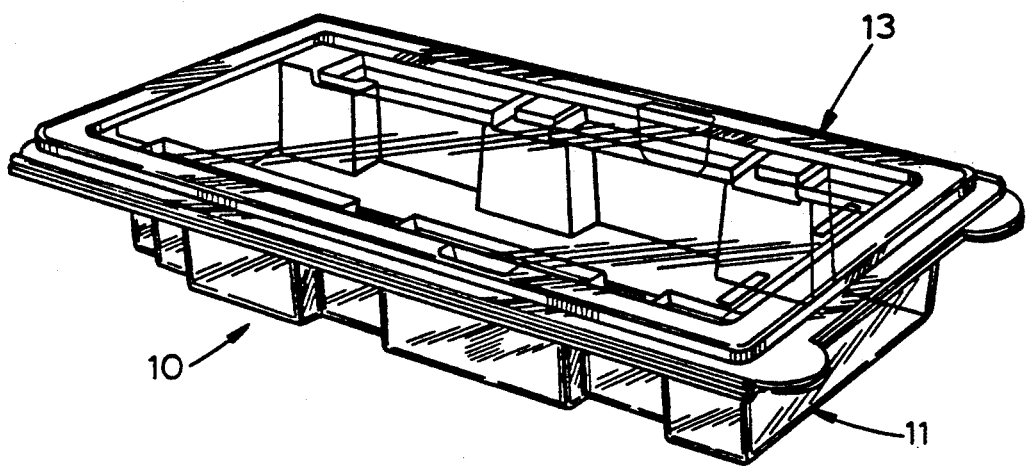
FIG. 1 is a perspective view showing a package constructed in accordance with the present invention.

In addition, seal tabs are preferably provided on the box 11 and the two lids 12 and 13 to assist in opening the package and to indicate whether a package has been opened. Two tabs 72 and 73 are provided on opposite sides of the lip of the box end wall 12, a tab 74 is provided on the outer end of the lip of the outer lid 13, and still another tab 75 is provided on the outer end of the lip of the inner flap 12. As shown in FIG. 2, the tab 75 overlies the tab 73 when the inner lid 12 is folded over the opened upper side of the box 11, and as shown in FIG. 1, the tab 74 overlies the tab 72 when the outer lid 13 is folded over the top of the inner lid 12. After the article 22 is placed in the box 11, a seal 81 is placed over the tabs 73 and 75, and after the related documents 68 are placed in the enclosure between the two lids 12 and 13, a seal 82 is placed over the tabs 72 and 74. To open the box, therefore, the seals must be moved or cut through, thereby giving a visual indication that the package has been opened.

In the specific example described herein wherein the package 10 is designed for a printed circuit board, the package is made of a clear thermoformable plastic such as a clear, rigid polyvinylchloride (PVC) film having static dissipative properties. As an alternative, the package may be made of polyethylene terethlate glycol (PETG) having static dissipative properties. A thin sheet of one of these materials may be formed into the shape described herein by conventional vacuum thermoforming processes.

In one method of use, the package contains printed circuit boards of the type used in telephone systems. The system includes distribution stations that include a number of such boards, and it is sometimes necessary for service personnel to remove and replace a defective board. Initially, a new or rebuilt printed circuit board 23 is placed in the box 11 and the inner lid 12 is folded over the top of the board snap-locked in place on the box 11. This action holds the board firmly in place and creates a static controlled environment for the printed circuit board. As shown in FIG. 6, the printed circuit board is positioned with the electrical components facing downwardly into the relatively large open space of the enclosure formed by the box 11. The raised center part 51 of the inner lid is spaced from the upper surface of the board so as not to contact or otherwise interfere with any leads appearing on the upper surface of the board. The edges of the board rest on the ledges 32 of the support posts 26 to 31, and the outer depressed portion 52 and 53 extend close to and hold the board in place with the electrical components and the leads thereon spaced from the package parts. After the inner lid 12 has been closed and snap-locked into place, the seal 81 is placed over the two tabs 73 and 75.

Thereafter, the documents 68 are positioned on top of the center part 51 of the inner lid 12 and the outer lid 13 is folded over the top of the documents and snap-locked in place. The second seal 82 is then fastened over the two tabs 72 and 74.

When in use by a telephone repair or service person in the field, the seal 82 holding the outer lid 13 to the box is broken and the documents removed from the enclosure between the two lids without interfering with the protective environment for the printed circuit board. Further, the upper surface of the inner lid 12 may be used as a work surface in the field. When it is necessary to replace a printed circuit board in a telephone switching network, the other seal 81 holding the inner lid 12 to the box is broken, the inner lid 12 opened or folded back and the new board is removed and installed. The defective board is placed in the same package, the inner lid 12 closed, and then documentation relating to the location from which the defective board has been removed, and any comments relating to the cause or nature of the defect, is placed in the enclosure between the two lids. Thereafter, the outer lid is closed over the top of the documents so that an accurate record of the defective or removed board is maintained along with the board.

It will, therefore, be apparent that a package in accordance with this invention offers numerous advantages. Where the plastic material is transparent, visual inspection and bar code scanning of the contents of the package may be accomplished without removing the board or the documents. The double lids offer extra protection for the contents of the package, and the package material offers static dissipative advantages.

In addition to being used by service personnel in the field, the package may also be used to mail articles, and the package may, of course, be reused provided that it has not been damaged. Still further, the plastic material is relatively inexpensive and may be recycled when its normal life is exhausted. The simplicity of the package permits it to be used for packaging printed circuit boards while eliminating the cushioning materials and outer boxes conventionally used.

What is claimed is:

1. A package forming a first enclosure and a second enclosure for a first article and a second article, said package comprising
   a) a box having a bottom and at least a first side wall and a second side wall forming said first enclosure;
   b) a first lid hingedly connected to said first side wall and foldable to a first closed position to cover said first enclosure;
   c) said first lid and said side walls including means for engaging and holding a first article suspended in said first enclosure and spaced from said bottom;
   d) a second lid hingedly connected to said second side wall and foldable over said first lid to a second closed position, said first lid and said second lid forming said second enclosure therebetween for a second article; and
   e) engaging means on said box and on said lids for holding said lids in said first and second closed positions.

2. A package as set forth in claim 1, wherein said box and said lids are formed of a clear plastic.

3. A package as set forth in claim 1, wherein said box and said lids are made of a material having static-dissipative properties.

4. A package as set forth in claim 1, wherein said box includes said first and second side walls and two end walls, said first and second side walls being on opposite sides of said bottom, and said first and second lids folding in opposite direction to said first and second closed positions.

5. A package as set forth in claim 1, and further including seal tab means on said box and on said first and second lids for receiving a seal and assisting in opening said package.

6. A package as set forth in claim 5, wherein said seal tab means comprises first and second tabs on said first and second lids, respectively, a third tab on said box and located adjacent said first tab when said first lid is in said first closed position, and a fourth tab on said second lid and adjacent said second tab when said second lid is in said second closed position.

7. A package as set forth in claim 1, wherein said side walls include fingerreceiving recesses.

8. A package as set forth in claim 1, wherein a said first article comprises a printed circuit board and a said second article comprises documents relating to said printed circuit board.

9. A package forming a first enclosure and a second enclosure for a first article and a second article, said package comprising
   a) a box having a bottom and at least a first side wall and a second side wall forming said first enclosure;
   b) a first lid hingedly connected to said first side wall and foldable to a first closed position to cover said first enclosure;
   c) said first lid and said side walls including means for engaging and holding a first article in place in said first enclosure;
   d) a second lid hingedly connected to said second side wall and foldable over said first lid to a second closed position, said first lid and said second lid forming said second enclosure therebetween for a second article; and
   e) engaging means on said box and on said lids for holding said lids in said first and second closed positions, said means for engaging and holding a first article comprising posts formed on said side walls and surfaces on the outer periphery of said first lid, said posts and said surfaces being engageable with opposite sides of a said first article.

10. A package as set forth in claim 9, wherein said posts further include upstanding head and said outer periphery of said first lid engages said heads.

11. A method of use of a package formed by a box, a first lid and a second lid, the first and second lids being hinged to the box, the box forming a first enclosure and including means for engaging an article and the first lid being foldable to close the first enclosure, the second lid being foldable over the first lid to form a second enclosure therebetween, said method comprising the steps of:
   a) placing a first article in the first enclosure and folding the first lid over the first article, said first article being engaged and suspended between the bottom of said box and said first lid by said engaging means;
   b) placing a second article on the first lid and folding the second lid over the article to enclose the second article in the second enclosure, the second article comprising a document pertaining to the first article;
   c) removing a third article from an installation;
   d) unfolding said first and second lids and removing said first and second articles from said first and second enclosures;
   e) installing said first article in place of said third article;

f) placing said third article in said first enclosure and folding said first lid over said third article; and g) placing commentary relating to said third article in said second enclosure and folding said second lid over said commentary and said first lid.

12. A method as set forth in claim 11 and further including the step after step (b) of fastening a seal between said box and at least one of said lids, and the step after step (c) of breaking said seal.

13. A method of use of a package formed by a box, a first lid and a second lid, the first and second lids being hinged to the box, the box forming a first enclosure and the first lid being foldable to close the first enclosure, the second lid being foldable over the first lid to form a second enclosure therebetween, said method comprising the steps of:

a) placing a first article in the first enclosure and folding the first lid over the first article;

b) placing a second article on the first lid and folding the second lid over the article to enclose the second article in the second enclosure, the second article comprising a document pertaining to the first article;

c) removing a third article from an installation;

d) unfolding said first and second lids and removing said first and second articles from said first and second enclosures;

e) installing said first article in place of said third article;

f) placing said third article in said first enclosure and folding said first lid over said third article; and g) placing commentary relating to said third article in said second enclosure and folding said second lid over said commentary and said first lid, said first and third articles being printed circuit boards.

* * * * *